US010183313B2

(12) United States Patent
Hardie

(10) Patent No.: US 10,183,313 B2
(45) Date of Patent: Jan. 22, 2019

(54) SYSTEM FOR PRODUCING SOUND WAVES

(71) Applicant: Atlas Elektronik UK Ltd, Winfrith, Newburgh, Dorchester (GB)

(72) Inventor: David Hardie, Winfrith (GB)

(73) Assignee: Atlas Elektronik UK Ltd, Winfrith Newburgh (GB)

( * ) Notice: Subject to any disclaimer, the term of this patent is extended or adjusted under 35 U.S.C. 154(b) by 355 days.

(21) Appl. No.: 14/911,006

(22) PCT Filed: Aug. 11, 2014

(86) PCT No.: PCT/GB2014/052451
§ 371 (c)(1),
(2) Date: Feb. 8, 2016

(87) PCT Pub. No.: WO2015/019116
PCT Pub. Date: Feb. 12, 2015

(65) Prior Publication Data

US 2016/0193629 A1 Jul. 7, 2016

(30) Foreign Application Priority Data

Aug. 9, 2013 (GB) .................................. 1314326.8

(51) Int. Cl.
*B06B 1/06* (2006.01)
*H01L 41/08* (2006.01)

(52) U.S. Cl.
CPC .......... *B06B 1/0614* (2013.01); *B06B 1/0633* (2013.01); *B06B 1/0655* (2013.01); *B06B 2201/74* (2013.01)

(58) Field of Classification Search
CPC ... B06B 1/0614; B06B 1/0633; B06B 1/0655; G10K 11/008
See application file for complete search history.

(56) References Cited

U.S. PATENT DOCUMENTS 3,182,284 A * 5/1965 Green .................. B06B 1/0622 310/337
3,243,768 A * 3/1966 Roshon, Jr. ........... B06B 1/0607 310/335
(Continued)

FOREIGN PATENT DOCUMENTS

CA 2357605 3/2003
EP 0169727 1/1986
(Continued)

OTHER PUBLICATIONS

Kunstal, E., Free-Flooded Ring Transducers: Design Methods and Their Interaction in Vertical Arrays, Oceans Oct. 2003, pp. 2074-2078.*

(Continued)

*Primary Examiner* — J. San Martin
(74) *Attorney, Agent, or Firm* — Workman Nydegger

(57) ABSTRACT

A system for producing sound waves in a medium, the system comprising: at least two first free-flooded ring transducers centered about a first axis, the first free-flooded ring transducers being substantially cylindrical and having an axial gap of height g therebetween such that they form a first column; and at least one cylindrical body centered about the first axis nested in the first column, such that the cylindrical body is aligned with the axial gap. The cylindrical body may be a tweeter free-flooded ring transducer. This provides for improved wideband performance in a free flooded ring array.

19 Claims, 9 Drawing Sheets

(56) References Cited

U.S. PATENT DOCUMENTS

| | | | | | |
|---|---|---|---|---|---|
| 3,755,698 | A | | 8/1973 | Trott | |
| 3,845,333 | A | * | 10/1974 | Holloway | B06B 1/0633 310/322 |
| 3,922,572 | A | * | 11/1975 | Cook | B06B 1/0607 310/334 |
| 4,972,390 | A | | 11/1990 | Pagliarini | |
| 6,768,702 | B2 | * | 7/2004 | Brown | B06B 1/0633 367/138 |
| 8,139,443 | B2 | * | 3/2012 | Armstrong | H04R 1/44 367/153 |
| 2002/0043897 | A1 | | 4/2002 | Dunn | |
| 2014/0354116 | A1 | * | 12/2014 | Xia | B81B 3/00 310/368 |

FOREIGN PATENT DOCUMENTS

| | | |
|---|---|---|
| EP | 0251797 | 1/1988 |
| GB | 1404727 | 9/1975 |
| WO | 2011035747 | 3/2011 |

OTHER PUBLICATIONS

Combined Search and Exam Report for application No. GB1314326.8 dated Feb. 20, 2014.

International Search Report and Written Opinion for PCT/GB2014/052451 dated Dec. 18, 2014.

Canadian Office Action for application No. 2,919,300 dated May 12, 2017.

* cited by examiner

SYSTEM FOR PRODUCING SOUND WAVES

CROSS-REFERENCE TO RELATED APPLICATIONS

The present invention is a 35 U.S.C. § 371 U.S. National Stage Application corresponding to PCT Application No. PCT/GB14/052451, filed on Aug. 11, 2014, which claims priority to Great Britain Patent Application No. 1314326.8, filed Aug. 9, 2013. The entire content of each of the aforementioned patent applications is incorporated herein by reference.

FIELD OF THE INVENTION

This invention relates to a system for producing sound waves in a medium, and in particular a sonar transducer.

BACKGROUND TO THE INVENTION

A robust sonar system is needed to locate and counter modern submarines. This is particularly the case in littoral waters, close to the shore, which typically have high levels of clutter and many sources of noise. In these difficult acoustic conditions, the use of Wideband Active Sonar (WAS) offers advantages over the performance of standard systems.

A system which uses WAS will incorporate a transducer or transducers which are capable of transmitting sound over a wide range of frequencies. A very wide transmission bandwidth is required, ideally two octaves or more. In addition, any transducer would ideally have high power and good directivity, as well as being compact. A key issue which must be addressed in WAS system design, therefore, is producing a practical transducer.

In relation to Sonar arrays, the term compact has a special meaning, relating the size of the array to the wavelength corresponding to its lowest fundamental frequency. For an array of length L and fundamental wavelength $\lambda_0$, the measure of compactness is the ratio $L/\lambda_0$. A compact array has a relatively small $L/\lambda_0$ ratio value, typically ≤1, where a conventional array would have a $L/\lambda_0$ ratio value of around 3. A compact array is desirable in that low frequencies can be produced, with commensurate increase in sonar detection range, without having to deploy or mount a large array with its impact on weight, cost etc.

Many sonar transmitters use Free-Flooded Ring (FFR) transducers. FFR transducers can be used as high powered sonar transmitters. Additionally, they have a wide bandwidth, typically in the region of 1 octave; and are depth independent. FIG. 1 is an illustration of such an FFR transducer 100. All FFR transducers can be assumed to be geometrically and mechanically "thin-walled", whereby the thickness is always small compared to the mean radius a and axial height h. Free-flooded ring transducers typically comprise segments 102 of a piezoelectric ceramic, arranged in a ring such that an electrical current applied to the ring can cause it to change size and so generate sound waves. Free-flooded ring transducers are typically provided with a waterproof covering, such as a rubber, oil-filled boot and arranged in a support cradle, however these components are not shown in FIG. 1.

The outer radius of a free-flooded ring transducer is the outer radius of the ring of piezoelectric ceramic when in a resting state, that is when not exposed to an electrical current.

Typical FFR transducers can provide a bandwidth of nearly an octave by exploiting two different modes of vibration. In a cavity mode, the FFR transducer 100 vibrates slowly enough that water is drawn in and out of the cavity in the middle of the ring. It is the drawing in and pushing out of the water that creates the sonar transmission in an FFR transducer operating in cavity mode.

As the rate of vibration in the FFR transducer 100 is increased, the FFR transducer will begin to function in a radial mode. In a radial mode, the FFR transducer vibrates such that sound waves are transmitted primarily from the outer surface of the cylinder.

FIG. 2 is a graph showing the sound level produced by the FFR transducer 100 over a range of frequencies. The FFR transducer 100 is used between the lowest of the cavity mode frequencies, $f_c$, and the highest of the radial mode frequencies $f_r$. This is the FFR transducer's effective bandwidth. The shape of this graph is determined, in part, by the dimensions of the FFR transducer 100, in particular the axial height h and the mean radius a as indicated in FIG. 1. An FFR transducer is "mode balanced" when the ring's radius is approximately the same as the ring's height, i.e. when $a \approx h$. In a mode balanced transducer such as the FFR transducer 100, the cavity mode frequencies and the radial mode frequencies together provide a continuous range of frequencies over which the FFR transducer 100 can be used, as illustrated in FIG. 2, such that $f_r \approx 2f_c$.

FIG. 3 shows a single FFR transducer 100 in a cradle 350 for forming a columnar array of FFR transducers. The cradle 350 comprises a base formed of three spokes 352, with the distal end of each spoke mounting a substantially vertical guide rail 354. The FFR transducer 100 is connected to each guide rail, so as to be held in place. The guide rails and connections do not interfere with the operation of the FFR transducer 100.

Free-flooded rings are rings in the sense that they are cylindrical and provided with a cavity substantially coincident with the first axis. In use, the cavity is open to the medium and substantially filled with the medium. This gives rise to the terminology of a 'flooded' ring, particularly when the medium is question is water.

FIG. 4(*a*) shows a co-axial column 300 of FFR transducers 100, forming a columnar array. The FFR transducers 100 are placed half a wavelength apart in order to minimise interactions between the FFR transducers 100 during use and so reduce sources of interference. The co-axial column 300 can provide a beam of sound along a plane normal to its axis, but only over a bandwidth of approximately one octave. This is because the bandwidth of an array such as the co-axial column 300 is the same as the bandwidth of an individual FFR transducer 100.

However, a bandwidth of greater than one octave is desired for wideband performance. One method for producing a multi-octave array is to use multiple columns, with each column producing sound over a different octave. Such a system can be seen in FIG. 4(*b*), where three columns 310, 320, 330 are arranged side by side. The columns have different diameters, with the first column having a first, large diameter; the middle column having a second, medium diameter; and a third column having a third, small diameter. However such designs have significant drawbacks. Firstly, they are large and cumbersome. Secondly, the beam pattern of each column is impeded by the other, surrounding columns. Therefore each column has poor horizontal directivity.

In light of this, an increased-bandwidth transmitter that is compact and provides good directivity is desirable. Such a transmitter may be useful in a WAS system.

BRIEF SUMMARY

In pursuit of this aim, the present disclosure includes a system for producing sound waves in a medium. The system comprises: at least two mode balanced first free-flooded ring transducers centred about a first axis, the first free-flooded ring transducers being substantially cylindrical and having an axial gap of height g therebetween such that they form a first columnar array; and at least one cylindrical body centred about the first axis, wherein the internal radius of the first free-flooded ring transducers is larger than the radius of the cylindrical body and the cylindrical body is aligned with the axial gap between the pair of woofer free-flooded ring transducers.

In another aspect of the disclosure, there is provided a system wherein the first array comprises at least three first free-flooded ring transducers, each first free-flooded ring transducer being separated from its neighbours by the axial gap of height g.

In a further aspect of the disclosure, there is provided a system comprising a plurality of cylindrical bodies arranged in a columnar secondary array, such that a cylindrical body is located aligned with each axial gap between two woofer free-flooded ring transducers. Preferably, the cylindrical body may be centrally aligned with the axial gap between first free-flooded ring transducers In one aspect of the disclosure, there is provided a system wherein the height g of the axial gap is much less than the fundamental wavelength $\lambda_1$ of the woofer free-flooded ring transducers, that is $g \ll \lambda_1$.

In an aspect of the disclosure, there is provided a system wherein the at least one cylindrical body is a tweeter free-flooded ring transducer, of fundamental wavelength $\lambda_2$.

In another aspect of the disclosure, there is provided a system wherein the height g of the axial gap is greater than fundamental wavelength $\lambda_2$ of the tweeter free-flooded ring transducer divided by two times pi, that is $g > \lambda_2/2\pi$.

In one aspect of the disclosure, there is provided a system wherein the height g of the axial gap is approximately equal to the fundamental wavelength $\lambda_1$ of the woofer free-flooded ring transducer divided by four times pi, that is $g \approx \lambda_1/4\pi$.

In an aspect of the disclosure, there is provided a system wherein the radius of each woofer free-flooded ring transducer is twice the radius of each tweeter free-flooded ring transducer.

In another aspect of the disclosure, there is provided a system, wherein the medium comprises water. The medium could also be air, earth, or any other fluid or solid which is capable of transmitting a sound wave.

According to a further aspect of the disclosure there is provided a sonar apparatus comprising a system as described herein.

A system according to the disclosure may also be used as a speaker, for broadcasting information through air or water, or for any other application in which sound must be transmitted through a medium.

The first and second free-flooded ring transducers may also be of different heights. For example, the segments of piezoelectric ceramic in a woofer free-flooded ring transducer may be longer, when measured along a line parallel to the first axis, than the segments of piezoelectric ceramic in a tweeter free-flooded ring transducer.

Each axial gap is typically filled with the medium, in use. The height of each axial gap g may be measured as the distance between surfaces which, in use, vibrate.

The system according to the invention may be provided with a container, such that the system and the medium are enclosed within the container. Typically, the container will be chosen so as to be substantially transparent to sound waves in the medium at the frequencies at which the system may operate.

Advantages of these aspects are set out hereafter, and further details and features are defined in the accompanying dependent claims and elsewhere in the following detailed description.

BRIEF DESCRIPTION OF THE DRAWINGS

Various aspects of the teachings of the present invention, and arrangements embodying those teachings, will hereafter be described by way of illustrative example with reference to the accompanying drawings, in which:

a.

b.

c.

d.

e. FIG. 4(*b*) shows a prior-art multi-column array of free-flooded ring transducers;

f.

a.

a.

b.

d.

DETAILED DESCRIPTION OF PREFERRED EMBODIMENTS

Preferred embodiments of the present disclosure will now be described with particular reference to a system for producing sound waves in a medium, and a sonar apparatus comprising such.

Figure 1:
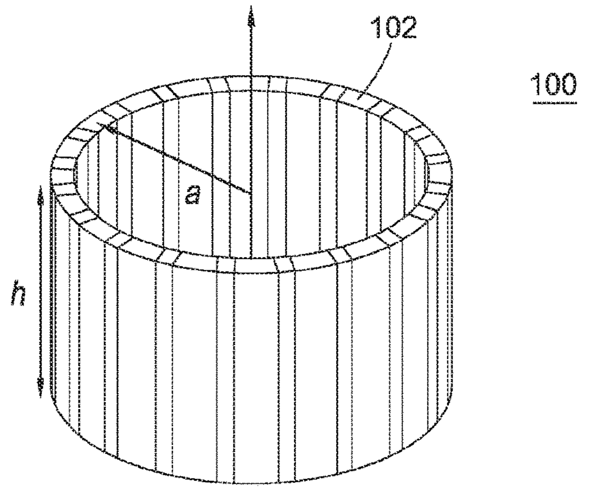
FIG. 1 shows a known free-flooded ring transducer.
Figure 2:
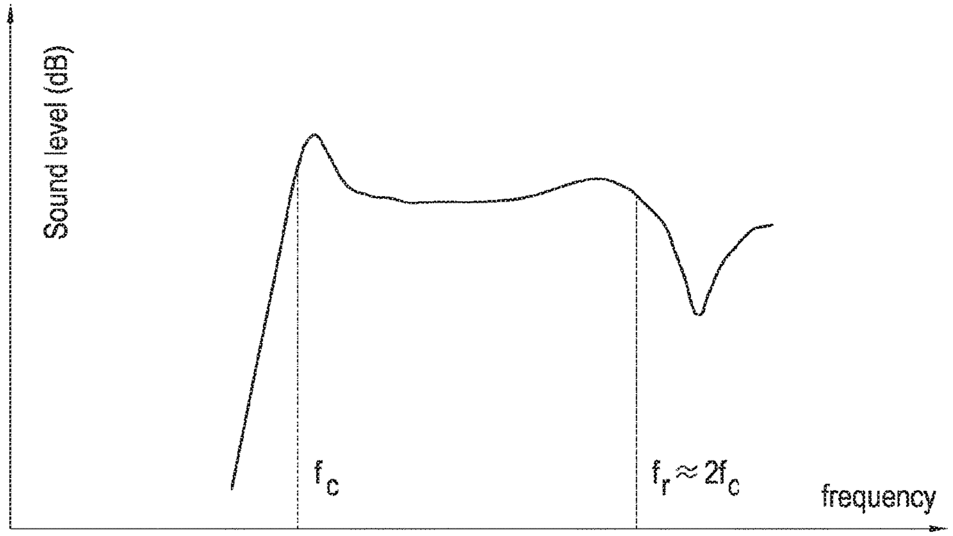
FIG. 2 is a chart showing the sound level produced by a known free-flooded ring transducer at certain frequencies.
Figure 3:
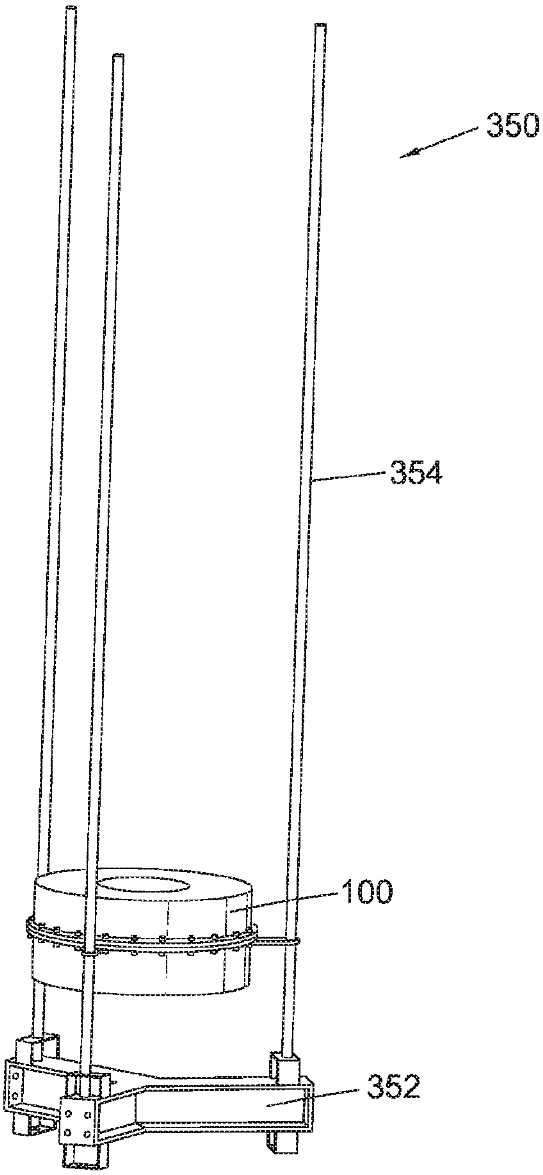
FIG. 3 shows a known free-flooded ring transducer in a cradle for use in forming a co-axial column of free-flooded ring transducers.
Figure 4A:
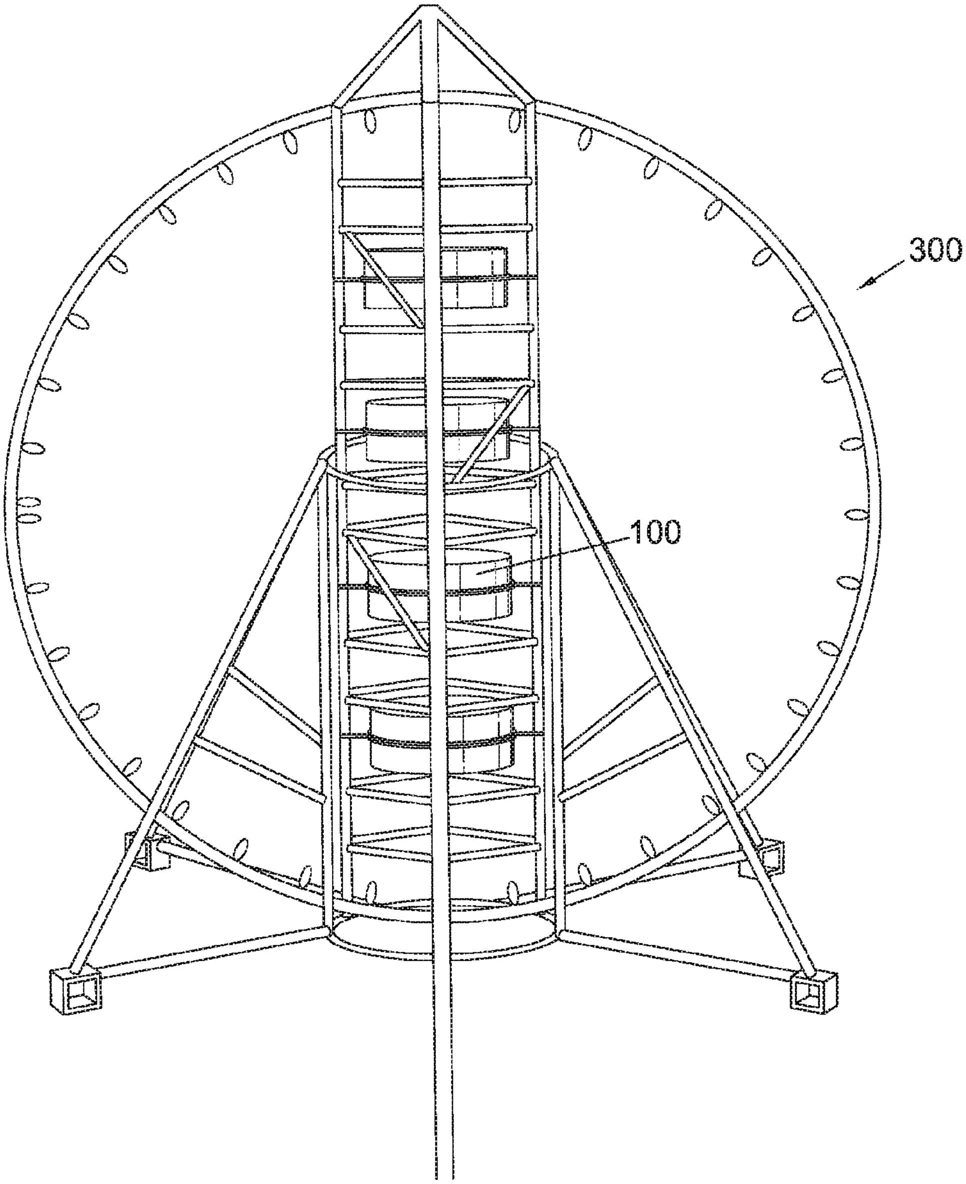
FIG. 4(*a*) shows a prior-art conventional column of co-axial free-flooded ring transducers in a cradle.
Figure 4B:
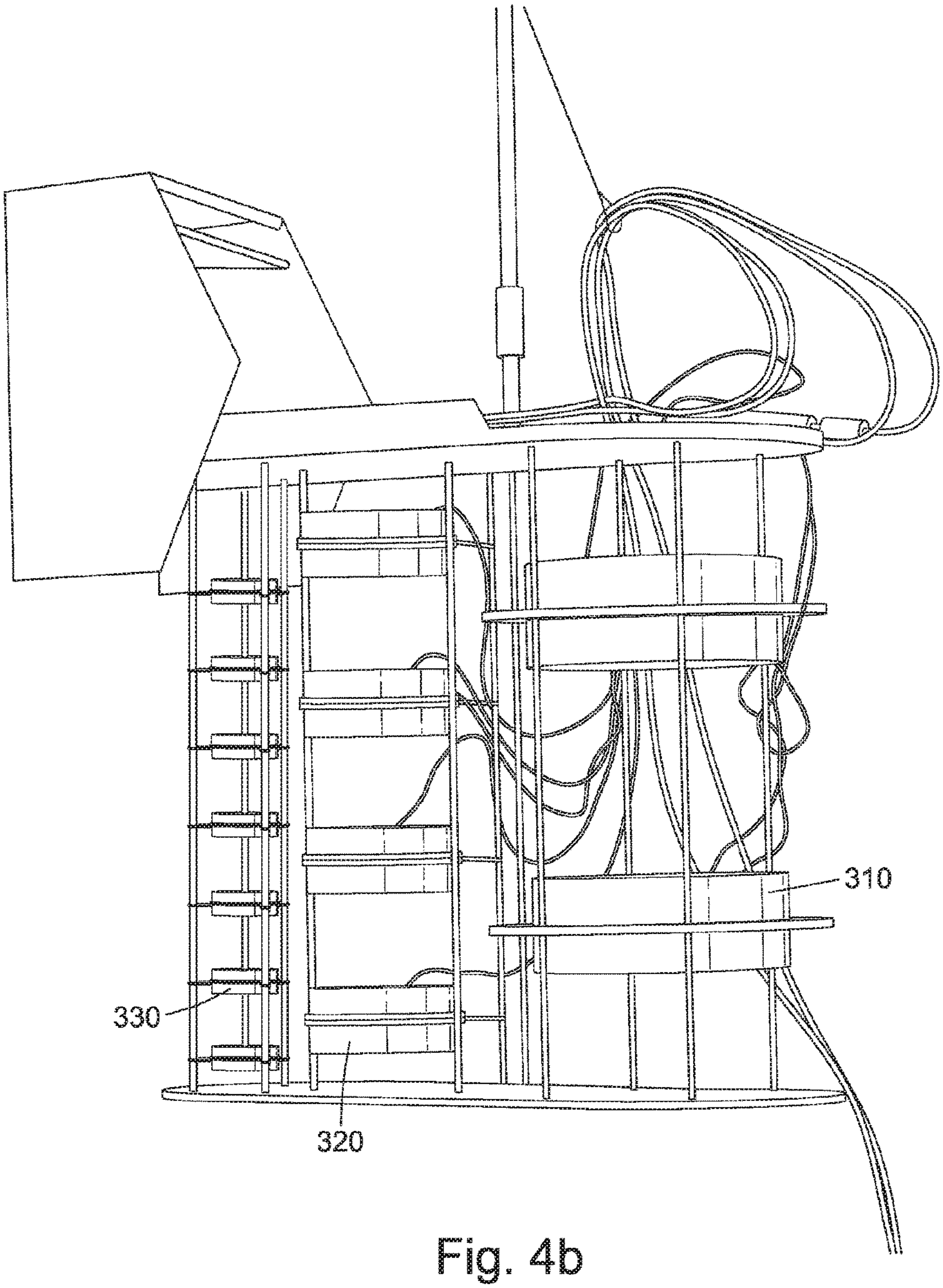
Figure 5:
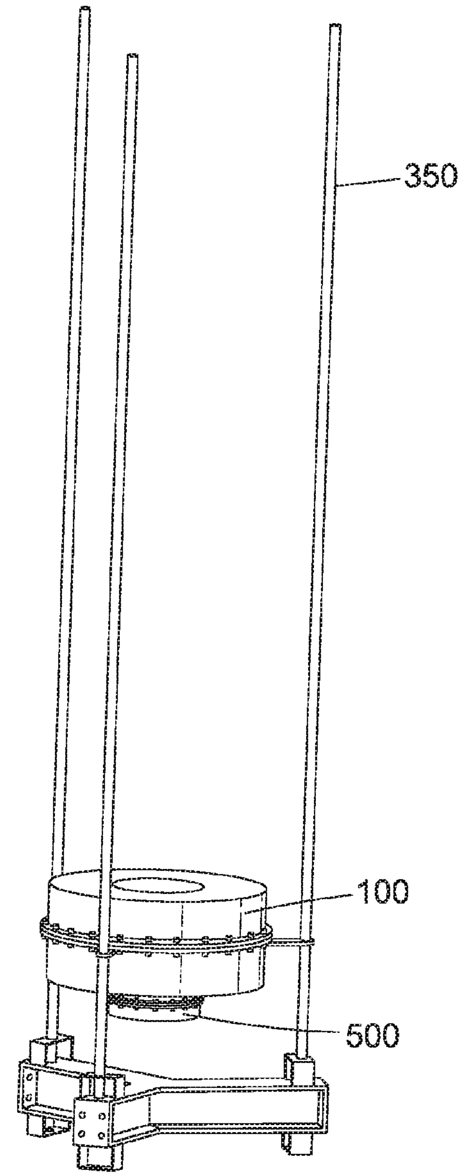
FIG. 5 shows a single free-flooded ring transducer with a single cylindrical body nested therein.

FIG. 5 shows a first FFR transducer 100 in the cradle 350 as before. In use, this first FFR transducer may be used to transmit lower frequencies in the desired range and hence may be referred to as a woofer free-flooded ring transducer 100 or woofer FFR 100. In this instance a cylindrical body 500 is co-axially located with the woofer FFR 100 such that it is partially nested within the woofer FFR 100. The outer diameter of the cylindrical body 500 is smaller than the inner diameter than the woofer FFR 100 such that the cylindrical body 500 may fit within the woofer FFR 100. The cylindrical body 500 is located such that it extends into the bottom of the woofer FFR 100. The woofer FFR 100 and cylindrical body are held in place by the cradle 350. The cradle 350 is arranged such that there is no impediment to fluid motion through the gap between the Woofer FFRs 100.

The FFR transducer 100 comprises a ring whose N segments 102 are made of pieces of a piezoelectric ceramic. The segments 100 are bound by pre-stress fibre winding. Each woofer FFR 100 is surrounded by a rubber boot, which provides a waterproof container therefore. The rubber boot is also ring shaped, so that water can flow through its centre, in use. The rubber boot is filled with oil, such that it contains no air pockets. For this reason, the woofer FFRs 100 are insensitive to changes in pressure such as those experienced by sonar equipment when immersed in water.

The cylindrical shape of the woofer FFR 100 provides uniform directivity in a plane normal to the axis of the ring.

Figure 6:
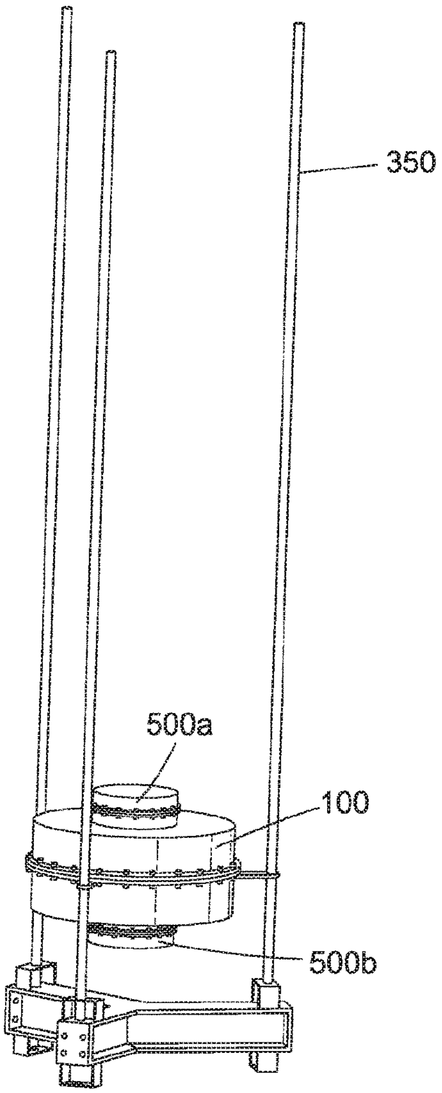
FIG. 6 shows a single free-flooded ring transducer with a pair of cylindrical bodies nested therein.

FIG. 6 shows a similar arrangement to that shown in FIG. 5, where a single woofer FFR 100 is held in a cradle, and a pair of cylindrical bodies 500*a,* 500*b* are located co-axially with the woofer FFR 100, and partially nested within the woofer FFR 100. The first cylindrical body 500*a* projects from the top of the woofer FFR 100, while the second cylindrical body 500*b* projects from the bottom of the woofer FFR 100.

Figure 7:
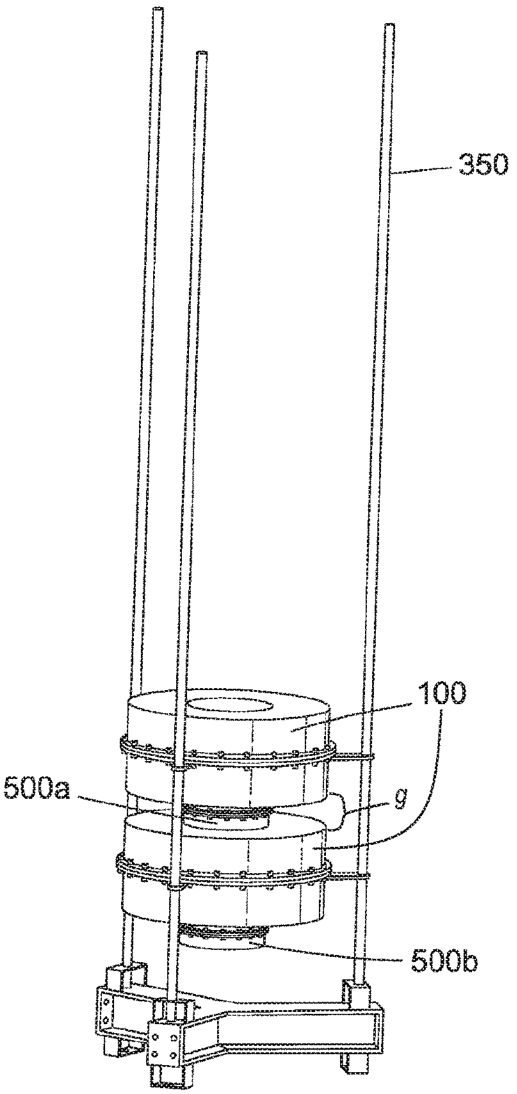
FIG. 7 shows a pair of free-flooded ring transducers with a pair of cylindrical bodies nested therein.

FIG. 7 shows a further similar arrangement, but this time comprising a pair of spaced-apart woofer FFRs 100, formed into a columnar array, and a pair of cylindrical bodies 500*a,* 500*b*. The second woofer FFR 100 is located above the first woofer FFR 100 such that the first cylindrical body 500*a* is partially nested in both the first and second woofer FFRs 100. The cylindrical body 500*a* is centrally aligned with the axial gap between the pair of woofer FFRs 100.

Figure 8:
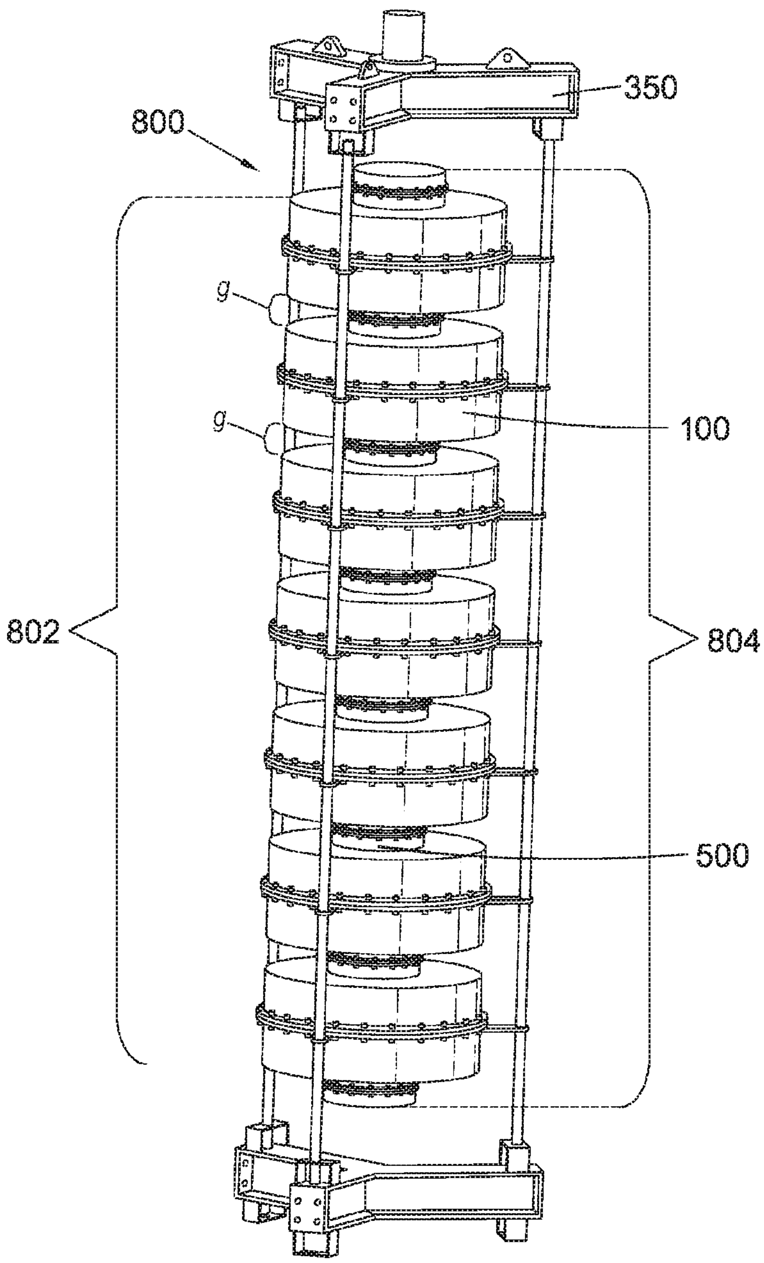
FIG. 8 shows a co-axial column of free-flooded ring transducers and nested cylindrical bodies c.

FIG. 8 shows a system 800 for producing sound waves according to the disclosure. The system 800 comprising seven woofer FFRs 100 formed into a first columnar array 802, which may also be referred to as a columnar woofer array 802. The system further comprises eight cylindrical bodies 500, forming a columnar secondary array 804. The columnar secondary array 804 is nested inside the columnar woofer array 802, with each cylindrical body 500 being aligned with an axial gap between a pair of adjacent woofer FFRs 100. Each of the cylindrical bodies 500 comprises a substantially cylindrical shape having defined therein an axial cavity (not illustrated) such that water can pass through the centre of the cylindrical bodies 500 in use. Each of the woofer FFRs 100 comprises a substantially cylindrical shape having defined therein an axial cavity such that water can pass through the centre of the woofer FFRs 100 in use.

The columnar woofer array 802 may be referred to as the first columnar array, the outer array or the outer column, while the columnar secondary array 802 may be referred to as the inner array or the inner column.

The columnar woofer array 800 and columnar secondary array 804 are coaxial, collocated and concentric.

In use, an electrical current is put through an FFR transducer 100, causing the piezoelectric segments 102 to change size. Hence the FFR transducer 100 vibrates, and the frequency of that vibration can be controlled to produce an active sonar transmission, as required.

The height of each woofer FFR 100 is approximately twice the height of each cylindrical body 500. The outer radius of each woofer FFR 100 is approximately twice the outer radius of each first cylindrical body 500.

In use, the nested arrays are supported by a cradle 350 and encased in a shell (not shown) which is shaped so as to be nearly acoustically transparent at the frequencies of interest and whose materials are chosen to provide the same properties.

Figure 9:
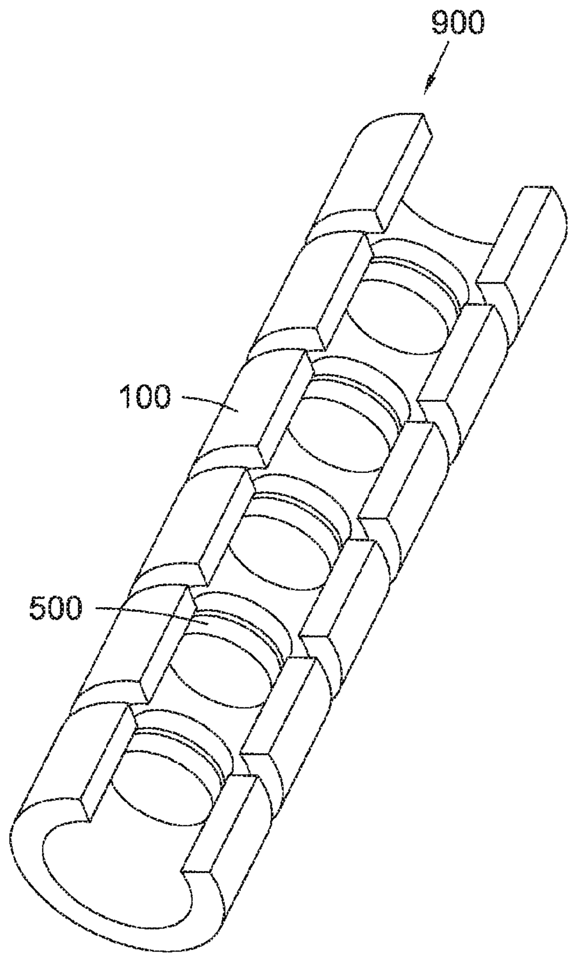
FIG. 9 shows a cut-away co-axial column of free-flooded ring transducers.

FIG. 9 shows a cut-away view of a representation of a system according to the invention comprising a pair of nested arrays. The location of the cylindrical bodies 500 at the axial gaps between the woofer FFRs 100 is clearly shown.

The presence of the at least one cylindrical body moderates, due to the scattering of sound, the deleterious interaction effects that occur, particularly at low frequencies, between neighbouring first free-flooded ring transducers. This in turn allows the first free-flooded ring transducers to be spaced more closely together, therefore providing a more compact array. Additionally, the closer spacing allows for the useful generation of an "organ pipe" mode (governed by the height of the gap, g) at a lower fundamental frequency to that of an individual first free-flooded ring transducer or of an array thereof with a typical separation of $\lambda/2$. If the axial gap between the first free-flooded ring transducers is small enough, they undergo mutual acoustic interaction via the fluid medium at certain frequencies. Since the wavelength is greater than the size of the axial gap, the comparatively large waves of sound in the water will not propagate significantly through the axial gaps between the first free-flooded ring transducers. As such, interaction at lower frequencies results in a strong radiative coupling between the first free-flooded ring transducers within the first columnar array. This allows with the woofer FFRs cooperating in the first columnar array to co-operate with each other, so as to operate more like a single pipe, analogous to a pipe in a pipe organ, referred to as organ pipe mode.

The axial gap is typically filled with the medium, in use. The height of the axial gap g may be measured as the distance between surfaces which, in use, vibrate.

Furthermore, the scattering of the sound within the "organ pipe" due to the at least one cylindrical body results in a slight lowering of the effective sound speed within the array cavity space or "pipe". This produces an additional lowering of the fundamental frequency at which the array strongly radiates sound, making the array more compact still compared to conventional array designs.

Moreover, at high frequencies, the first free-flooded ring transducers can be made to radiate sound more efficiently due to the baffling effect of the cylindrical bodies. This moderates a disadvantageous tendency to produce adverse effects at the edges of the woofers where normally a lone first FFR would exhibit stronger axial deformation.

As such, the system can provide sound waves at a high volume over a wider range of frequencies than was previously available from a woofer FFR array of the same physical size.

The advantages discussed above are provided by the presence of the passive cylindrical bodies nested in the woofer columnar array. However, in an alternative arrangement the cylindrical bodies may also be active free flood ring transducers, typically transducers that operate at higher frequencies. Such a high-frequency free-flooded ring transducer may be referred to as a tweeter FFR. By using an array of tweeter FFRs as the columnar secondary array nested within the woofer columnar array, the system of the disclosure can provide high power sound radiation over the mid-band frequencies where the woofer FFRs naturally lose power due to diffraction effects. The sound radiation of the tweeter free-flooded ring transducers is not impeded by the presence of the woofer free-flooded ring transducers since the axial gap is sufficiently large to allow the resultant sound field to radiate to the far-field.

The columnar secondary array comprised of tweeter FFRs may be referred to as the columnar tweeter array. Preferably, the radius of each woofer FFR is twice the radius of each tweeter FFR transducer, so as to provide an even spread of frequencies, as the frequencies of the FFRs scale with their dimension.

The use of a tweeter FFR as the cylindrical body used to form the columnar secondary array allows for wideband operation of the system of the disclosure. This wide bandwidth provides benefits in many uses, and in particular when used as part of a Wideband Active Sonar (WAS) system. Firstly, the wide bandwidth enables the WAS system to better adapt to the environment in which it is operated, by adjusting the frequencies used to maximise signal propagation and detection range. Secondly, the wide bandwidth provides improved target resolution in a WAS system, making it easier to correctly classify an object, and so reducing the number of false alarms. Thirdly, the wide bandwidth provides improved reverberation rejection in the presence of clutter. Fourthly, multiple WAS systems can co-operate with each other more effectively than narrower bandwidth systems, by allocating unique bandwidth to each system and so reducing interference with the other co-operating WAS systems.

The tweeter FFRs of the columnar tweeter array are enclosed within a rubber boot, similar to the woofer FFRs. However, the rubber boot of the tweeter FFRs may enclose the cavity within the ring, as long as there is an equivalent medium inside the ring cavity to that of the surrounding medium. For example, the boot could contain water but could also contain oil. If oil is used, it must have a similar acoustic impedance to that of water denoted by the product of the fluid's sound speed and its density.

The free flooded ring transducers may comprise rings formed from a number of segments of piezoelectric ceramic. Preferably, the woofer FFRs and tweeter FFRs are made from the same type of piezoelectric ceramic and have the same configuration, in that if rings of the woofer FFRs comprise N segments, then the rings of tweeter FFRs should also comprise N segments.

Figure 10:
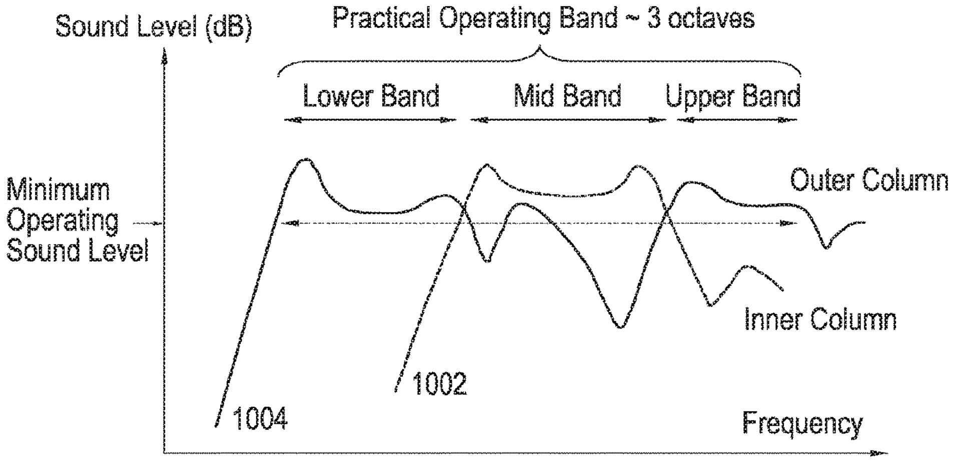
FIG. 10 is a chart showing the sound level produced by the nested array of rings at certain frequencies; and e.

FIG. 10 is a graph showing the sound level produced by the columnar woofer array 802 and a columnar secondary array of tweeter FFRs in the system 800 over a range of frequencies. The dashed line 1002 on the graph in FIG. 10 illustrates the sound level produced when the columnar secondary array of tweeter FFRs is driven with an electrical current, and the columnar woofer array 800 is left inert. The solid line 1004 on the graph in FIG. 10 illustrates the sound level produced when the columnar woofer array 802 is driven with an electrical current, and the columnar secondary array is left inert. The graph in FIG. 10 is divided into three bands, a lower band, corresponding to the lower portion of the output of the woofer array; a mid-band, corresponding to the output of the tweeter FFRs; and an upper band, corresponding to the upper portion of the output of the woofer array. Each band is approximately up to one octave wide. The central frequency of the upper band is around four times that of the central frequency of the lower band. The actual values depend on the size and configuration of the FFRs, but the lowest frequency may be around 1 kHz and the highest may be over 30 kHz in water.

As can be seen in FIG. 10 the woofer FFRs operate well in the lower and top bands, but drop out somewhat in the mid band. The columnar woofer array operates in a cavity mode at the lower end of the mid band, and operates in a radial mode at the upper end of the mid band. The tweeter FFRs operate well in the mid-band. In this way, the combined nested arrays provide wideband transmission with a bandwidth of well over two octaves.

Selection of the height of the axial gap g between the woofer FFRs within the columnar woofer array is important for maximising the advantages of the disclosure. The woofer FFRs and the tweeter FFRs are roughly an octave apart in fundamental frequency and have roughly an octave bandwidth, whence the associated wavelengths are related by: $\lambda_2 \approx 2\lambda_2$, where $\lambda_1$ is the wavelength corresponding to the lowest fundamental frequency of the woofer FFRs and $\lambda_2$ is the wavelength corresponding to the lowest fundamental frequency of the tweeter FFRs.

In order to allow for the organ pipe mode of operation of the columnar array of woofer FFRs, the height of axial gap g should be much smaller than $\lambda_1$, that is: $g \ll \lambda_1$.

However, if the gap g is too small the tweeter FFRs will not radiate efficiently enough through the gap between the woofer FFRs. With a large enough axial gap between the woofer FFRs in the columnar woofer array, the sound waves produced by the tweeter FFRs will radiate through the axial gap with minimal distortion.

Basic wave mechanics indicate that the height of the axial gap g will be large enough if it is greater than $\lambda_2$ divided by $2\pi$; that is if $g > \lambda_2/2\pi$.

If we combine the two conditions for g and the relationship between $\lambda_1$ and $\lambda_2$, we get the following indication for the height of the axial gap g: $g \approx \lambda_1/4\pi$. Meeting this condition therefore ensures that the axial gap is small enough to allow the organ pipe mode of operation to occur in the woofer columnar array, but not so small that it prevents efficient radiation by the tweeter free-flooded ring transducers through the axial gap.

Typically, for any system which comprises at least two woofer free-flooded rings separated by an axial gap of height g, the woofer free-flooded ring transducers will have a cut-off frequency $f_1$ in use, which is broadly equivalent to the individual woofer cavity mode frequency $f_c$. In this way there is a boundary in the sound level produced in the medium at $f_1$, $f_1$ corresponding to a wavelength $\lambda_1$ in the medium, such that:

$$2\pi g < \lambda_1.$$

A boundary, or boundary frequency, will be understood to refer the frequency at which useful sound radiation begins or ends. With g restrained in this way, the woofer free-flooded rings will interact at some frequencies. As such, instead of trying to avoid interaction effects, a system according to the disclosure may harness them.

It may also be that the tweeter free-flooded ring transducers have at least one boundary frequency $f_2$ in use, which is broadly equivalent in this case to the tweeter cavity mode, such that there is a boundary in the sound level produced in the medium at $f_2$, the boundary frequency $f_2$ corresponding to wavelength $\lambda_2$ in the medium such that:

$$2\pi g < \lambda_2.$$

It may also be that the tweeter free-flooded ring transducers have at least a second boundary frequency $f_3$ in use, which is broadly equivalent in this case to the onset of the first null due to diffraction, above the tweeter radial mode, such that there is a boundary in the sound level produced in the medium at $f_3$, $f_3$ corresponding to wavelength $\lambda_3$ in the medium such that:

$$\lambda_3 < 2\pi g.$$

With a small enough axial gap between the woofer FFRs in the columnar woofer array, the woofer FFRs will undergo mutual interaction in the lower band. In other words, the comparatively large waves of sound in the water will not propagate significantly through the axial gaps between the woofer FFRs, since the wavelength is greater than the size of the axial gap. As such, interaction in the lower band results in a strong radiative coupling between the woofer FFRs within the columnar woofer array. This co-operative effect, where the woofer FFRs cooperate via the fluid medium allows the columnar woofer array to operate more like a single pipe, analogous to a pipe in a pipe organ. As water is still drawn in and out of the woofer FFRs while operating in the lower band, primarily via each end of the columnar woofer array, this is a cavity mode.

Figure 11:
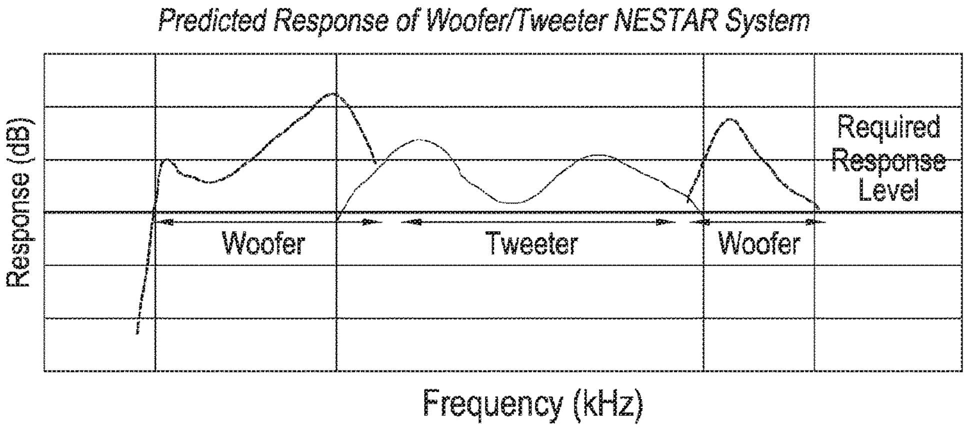
FIG. 11 is a chart showing the source level and effective working band of the system according to the disclosure.

In the upper band, the vibrations of the columnar woofer array produce sound waves with a wavelength significantly less than the height of the axial gaps g. Moreover, the tweeter FFRs tend to impede the flow of water through the columnar woofer array and through the axial gaps between the woofer FFRs. As such, the woofer FFRs operate in a radial mode over an extended set of frequencies in the upper band, as can be seen in FIGS. 10, 11 and 12.

As such, the nested arrays 800 can be used to produce sound over a frequency range of therebetween two and three octaves, using the columnar woofer array for the lower and upper bands, and the columnar tweeter array for the mid band. As well as this increase in bandwidth, the nested arrays 800 provide an omnidirectional horizontal beam pattern with no directivity.

The disclosure provides a system wherein the FFR transducers interact with other FFR devices in their array via acoustic coupling through the fluid medium.

In use, the system 800 is provided with simple switching circuitry in its power train so that the columnar woofer array is activated for frequencies in the lower and upper bands, and the columnar tweeter array are activated for frequencies in the mid band.

The system 800 can be used as a sonar transducer and can also be used as a speaker for transmitting information through water or through air, if required.

The use of the columnar secondary array of passive cylindrical bodies nest in the first columnar array of woofer FFRs provides a number of advantages. Their presence reduces the harmful interaction effects between neighbouring woofer FFRs 100, through the scattering of sound. This is particularly relevant at lower frequencies. This allows the woofer FFRs 100 to be positioned more closely together, which provides for a more compact array and also allows ‘organ-pipe’ operation of the array. Organ pipe operation lowers the fundamental frequency of the array, thereby increasing transmission distances. Furthermore, the combination of the organ pipe operation and the physical presence of the columnar secondary array of the cylindrical bodies results in a further lowering of the fundamental frequency of the array. This is due to the scattering of sound by the cylindrical bodies within the ‘organ pipe’ of the woofer columnar array. Finally, if the woofer columnar array is operating at a higher frequency range, for example around 30 kHz or higher, the cylindrical bodies provide a baffling effect to the woofer columnar array. Typically, the woofer FFRs would, when operating at higher frequencies, exhibit axial deformation at their edges, which would have a negative effect on transmission at those frequencies. However, the baffling effect of the cylindrical bodies reduces the axial deformation and thereby allows more efficient transmission of sound at those frequencies.

The present invention is scalable and suitable for use in a variety of applications. The chosen application governs the frequencies and sizes of FFRs to be used. Expected frequency ranges therefore map onto the range typical of FFR projectors and span from a few kilo-Hertz for long-range surveillance to slightly below a hundred kilo-Hertz in the case of short-range communications.

Throughout the description and claims of this specification, the words “comprise” and “contain” and variations of them mean “including but not limited to”, and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or the like described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A system for producing sound waves in a medium, the system comprising:

at least two first free-flooded ring transducers centred about a first axis the first free-flooded ring transducers being mode-balanced, the first free-flooded ring transducers being substantially cylindrical and having an axial gap of height g therebetween such that they form a first columnar array; and at least one cylindrical body centred about the first axis, wherein the internal radius of the first free-flooded ring transducers is larger than the radius of the cylindrical body and the cylindrical body is aligned with the axial gap between the pair of first free-flooded ring transducers.

2. The system according to claim 1, wherein the first array comprises at least three first free-flooded ring transducers, each first free-flooded ring transducer being separated from its neighbours by the axial gap of height g.

3. The system according to claim 2, wherein the system comprises a plurality of cylindrical bodies arranged in a columnar secondary array, such that a cylindrical body is located aligned with each axial gap between two first free-flooded ring transducers.

4. The system according to claim 1, wherein the height g of the axial gap is much less than the fundamental wavelength $\lambda_1$ of the first free-flooded ring transducers, that is $g \ll \lambda_1$.

5. The system according to claim 1, wherein the at least one cylindrical body is a second free-flooded ring transducer, of fundamental wavelength $\lambda_2$.

6. The system according to claim 5, wherein the height g of the axial gap is greater than fundamental wavelength $\lambda_2$ of the second free-flooded ring transducer divided by two times pi, that is $g > \lambda_2/2\pi$.

7. The system according to claim 5, wherein the height g of the axial gap is approximately equal to the fundamental wavelength $\lambda_1$ of the first free-flooded ring transducer divided by four times pi, that is $g \approx \lambda_1/4\pi$.

8. The system according to claim 5, wherein the radius of each first free-flooded ring transducer is twice the radius of each second free-flooded ring transducer.

9. The system according to claim 5 wherein the first free-flooded ring transducers and the second free-flooded ring transducers are constructed in a similar manner.

10. The system according to claim 9, wherein each free-flooded ring transducer is formed by N segments of the same piezoelectric ceramic material.

11. The system according to claim 1, wherein the medium comprises water.

12. A sonar apparatus comprising a system according to claim 1.

13. A system for producing sound waves in a medium, the system comprising:

at least two first free-flooded ring transducers centred about a first axis the first free-flooded ring transducers being mode-balanced, the first free-flooded ring transducers being substantially cylindrical and having an axial gap of height g therebetween such that they form a first columnar array; and at least one cylindrical body centred about the first axis, wherein:

the internal radius of the first free-flooded ring transducers is larger than the radius of the cylindrical body and the cylindrical body is aligned with the axial gap between the pair of first free-flooded ring transducers;

the first array comprises at least three first free-flooded ring transducers, each first free-flooded ring transducer being separated from its neighbours by the axial gap of height g; and the cylindrical body is centrally aligned with the axial gap between first free-flooded ring transducers.

14. The system according to claim 13, wherein the height g of the axial gap is much less than the fundamental wavelength $\lambda_1$ of the first free-flooded ring transducers, that is $g \ll \lambda_1$.

15. The system according to claim 13, wherein the at least one cylindrical body is a second free-flooded ring transducer, of fundamental wavelength $\lambda_2$.

16. The system according to claim 15, wherein the height g of the axial gap is greater than fundamental wavelength $\lambda_2$ of the second free-flooded ring transducer divided by two times pi, that is $g > \lambda_2/2\pi$.

17. The system according to claim 15, wherein the height g of the axial gap is approximately equal to the fundamental wavelength $\lambda_1$ of the first free-flooded ring transducer divided by four times pi, that is $g \approx \lambda_1/4\pi$.

18. The system according to claim 15, wherein the radius of each first free-flooded ring transducer is twice the radius of each second free-flooded ring transducer.

19. The system according to claim 18, wherein each free-flooded ring transducer is formed by N segments of the same piezoelectric ceramic material.

* * * * *